United States Patent
Lin et al.

(10) Patent No.: US 10,671,206 B1
(45) Date of Patent: Jun. 2, 2020

(54) METHOD TO MITIGATE COUPLING CAPACITANCE BETWEEN TOUCH SENSING EMITTER AND DISPLAY CATHODE OF A FLEXIBLE OLED DISPLAY APPARATUS, AND TOUCH DEVICE THEREFOR

(71) Applicant: Wuhan China Star Optoelectronics Technology Co., Ltd., Wuhan, Hubei (CN)

(72) Inventors: Dan Lin, Hubei (CN); Qibing Dai, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 334 days.

(21) Appl. No.: 15/749,042

(22) PCT Filed: Jan. 2, 2018

(86) PCT No.: PCT/CN2018/070038
§ 371 (c)(1),
(2) Date: Jan. 30, 2018

(87) PCT Pub. No.: WO2019/033692
PCT Pub. Date: Feb. 21, 2019

(30) Foreign Application Priority Data

Aug. 17, 2017 (CN) .......................... 2017 1 0708069

(51) Int. Cl.
*G06F 3/041* (2006.01)
*H01L 27/32* (2006.01)
*H01L 51/00* (2006.01)

(52) U.S. Cl.
CPC .......... *G06F 3/0416* (2013.01); *G06F 3/0418* (2013.01); *H01L 27/323* (2013.01);
(Continued)

(58) Field of Classification Search
CPC ........ G06F 3/0416–04186; G06F 2203/04102; H01L 2251/5338
See application file for complete search history.

(56) References Cited

U.S. PATENT DOCUMENTS

2010/0253638 A1* 10/2010 Yousefpor ............. G06F 3/0412
345/173

* cited by examiner

*Primary Examiner* — Laurence J Lee
(74) *Attorney, Agent, or Firm* — Hemisphere Law, PLLC; Zhigang Ma

(57) ABSTRACT

A touch device and a touch method of a flexible OLED display apparatus are provided. The touch method includes: acquiring a variation value of a cathode voltage when the display mode is switched; comparing the variation value of the cathode voltage with a preset threshold value, and when the variation value of the cathode voltage exceeds the preset threshold value, increasing the emitter electrode voltage of the touch electrode layer in the Flexible OLED display apparatus. When the cathode voltage changes due to the display mode switching, if the variation value thereof exceeds the preset threshold value, the voltage output amplitude of the emitter electrode is increased, so as to keep the amount of variation of the electric quantity of the receiver electrode constant, thereby keeping the electric quantity of the node capacitance between the emitter and receiver electrodes constant and enhancing the consistency of touch performance.

12 Claims, 3 Drawing Sheets

(52) U.S. Cl.
CPC ............... *H01L 51/0097* (2013.01); *G06F 2203/04102* (2013.01); *H01L 2251/5338* (2013.01)

METHOD TO MITIGATE COUPLING CAPACITANCE BETWEEN TOUCH SENSING EMITTER AND DISPLAY CATHODE OF A FLEXIBLE OLED DISPLAY APPARATUS, AND TOUCH DEVICE THEREFOR

RELATED APPLICATIONS

The present application is a National Phase of International Application Number PCT/CN2018/070038, filed Jan. 2, 2018, and claims the priority of China Application No. 201710708069.3, filed Aug. 17, 2017.

FIELD OF THE DISCLOSURE

The disclosure relates to the field of screen display technologies, and in particular to a touch device and a touch method of a flexible OLED display apparatus.

BACKGROUND

Flexible display is a competitive display technology in the future. Common OLED (Organic Light Emitting Diode) flexible display apparatus include a display panel and a touch panel on an upper surface thereof. The display panel includes a light emitting area and a non-light emitting area, and the touch panel includes a plurality of horizontal and vertical electrodes having a grid shape. In order to make the flexible display apparatus thinner and lighter, as shown in FIG. 1, the touch panel is directly fabricated above the encapsulation layer, and the touch electrode is only about ten microns away from the cathode, resulting in a large coupling capacitance between the emitter and receiver electrodes and the cathode. Therefore, most of the electric field lines are sucked by cathode, only a very small part thereof can reach to electric field lines are absorbed by the cathode, only a very small part thereof can reach to the receiver electrode. As shown in FIG. 2, when the finger touches, the amount of variation of the electric field of the receiver electrode is very small. When the cathode voltage changes with the display mode of the mobile phone (for example, when the display screen is dark or light) (e.g., −1V~−5V), the electric quantity of the coupling capacitance between the emitter and receiver electrodes and the cathode may be changed, resulting in the change of the amount of variation of the electric field of the receiver electrode, thereby affecting the touch performance.

SUMMARY

A technical problem to be solved by the disclosure is to provide a touch device and a touch method of a flexible OLED display apparatus which can effectively improve consistency of touch functions.

In order to solve the technical problem, the disclosure provides a touch method of a flexible OLED display apparatus, including:

acquiring a variation value of a cathode voltage when a display mode of the flexible OLED display apparatus is switched;

comparing the variation value of the cathode voltage with a preset threshold value, and when the variation value of the cathode voltage exceeds the preset threshold value, increasing the emitter electrode voltage of the touch electrode layer in the flexible OLED display apparatus.

The step of acquiring a variation value of a cathode voltage is specifically:

taking a current cathode voltage and a reference voltage as two inputs of an operational amplifier in a differential amplifier circuit; and acquiring an output voltage of the operational amplifier as the variation value of the cathode voltage.

The variation value of the cathode voltage is a difference or a multiple of the difference between the current cathode voltage and the reference voltage.

The step of acquiring a variation value of a cathode voltage is specifically: inputting the cathode voltage from a D/A conversion interface into the touch IC, and acquiring a digital variation value as the variation value of the cathode voltage by the touch IC through the analog variation of the cathode voltage.

The preset threshold value is respectively set for switching of different display modes.

The step of increasing the emitter electrode voltage specifically is increasing a product of the variation value of the cathode voltage and a constant on the emitter electrode voltage.

The disclosure further provides a touch device of a flexible OLED display apparatus, including:

a cathode voltage detection module, configured to acquire a cathode voltage variation value when a display mode of the flexible OLED display apparatus is switched;

a judging module, configured to judge a magnitude relation between a cathode voltage variation value acquired by the cathode voltage detection module and a preset threshold value; and an emitter electrode voltage adjusting module, configured to increase an emitter electrode voltage of a touch electrode layer in the flexible OLED display apparatus when the judging module judges that the variation value of the cathode voltage exceeds the preset threshold value.

The cathode voltage detection module includes a differential amplifier circuit, and the current cathode voltage and a reference voltage serve as two inputs of an operational amplifier in the differential amplification circuit, and an output voltage of the operational amplifier is the variation value of the cathode voltage.

The variation value of the cathode voltage is a difference or a multiple of the difference between the current cathode voltage and the reference voltage.

The cathode voltage detection module is a touch IC, the touch IC is configured to acquire a digital variation value corresponding to an analog variation of the cathode voltage input from the D/A conversion interface and use the digital variation value as the variation value of the cathode voltage.

The touch device further includes a presetting module, configured to set the preset threshold value respectively for switching of the different display modes.

The emitter electrode voltage adjusting module increasing the emitter electrode voltage specifically is increasing a product of the variation value of the cathode voltage and a constant on the emitter electrode voltage.

The beneficial effects of the embodiments of the disclosure are as follows: when the display mode is switched, the variation value of the cathode voltage is acquired and is compared with the preset threshold value, when the variation value of the cathode voltage exceeds the preset threshold value, an output voltage of an emitter electrode is increased, so as to keep an amount of variation of an electric quantity of the receiver electrode constant when the cathode voltage is changed, thereby keeping the electric quantity of the node capacitance between the emitter electrode and the receiver electrode constant and enhancing the consistency of touch performance.

BRIEF DESCRIPTION OF THE DRAWINGS

In order to illustrate technical schemes of the disclosure or the prior art more clearly, the following section briefly introduces drawings used to describe the embodiments and prior art. Obviously, the drawing in the following descriptions is just some embodiments of the disclosure. The ordinary person in the related art can acquire the other drawings according to these drawings without offering creative effort.

DETAILED DESCRIPTION OF PREFERRED EMBODIMENTS

The following description of various embodiments is made with reference to the accompanying drawings to illustrate specific embodiments in which the disclosure may be practiced.

Figure 1:
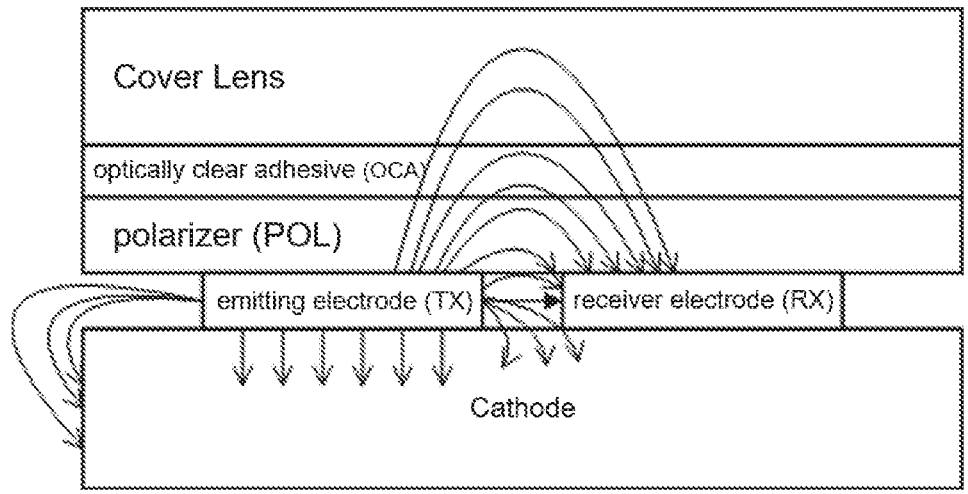
FIG. 1 is a schematic structural diagram of a current flexible display apparatus.
Figure 2:
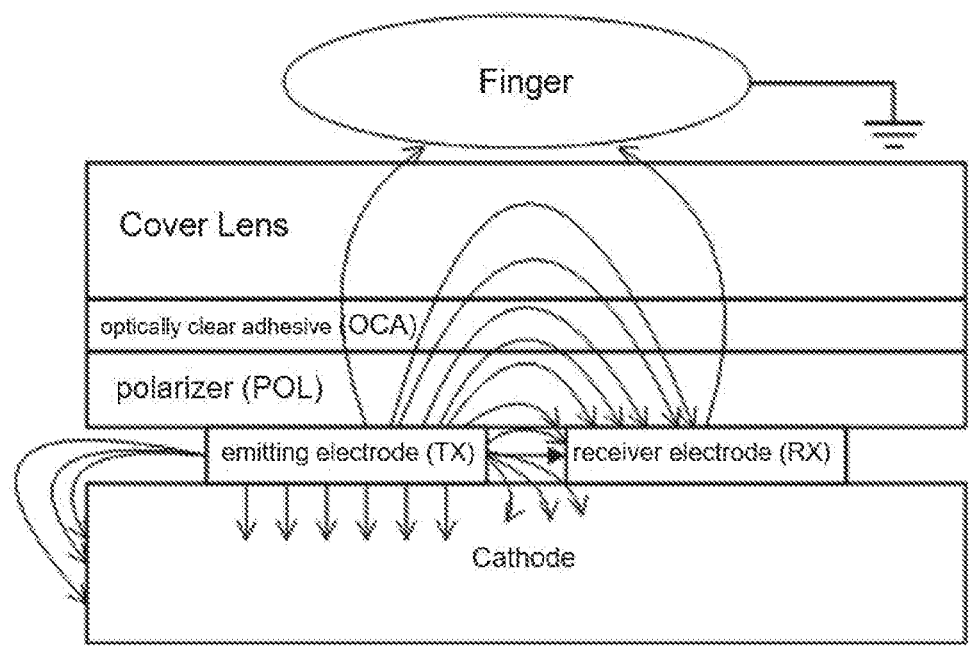
FIG. 2 is a schematic diagram of an electric field of a cathode and a touch electrode of the current flexible display apparatus.
Figure 3:
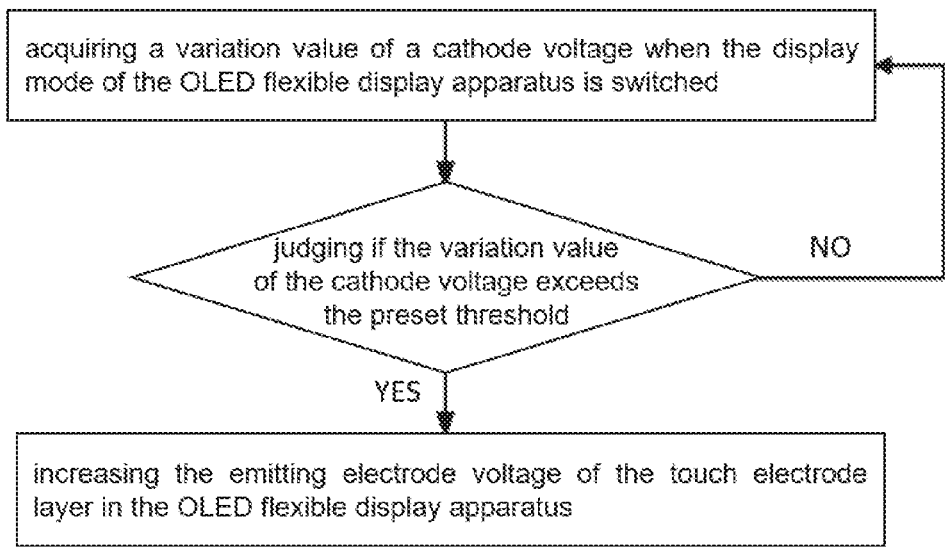
FIG. 3 is a flow chart of a touch method of a flexible display apparatus according to the first embodiment of the disclosure.

Referring to FIG. 3, which shows a touch method of a flexible OLED display apparatus according to the first embodiment of the disclosure, including:

acquiring a variation value of a cathode voltage when the display mode of the flexible OLED display apparatus is switched;

comparing the variation value of the cathode voltage with a preset threshold value, and when the variation value of the cathode voltage exceeds the preset threshold value, increasing an emitter electrode voltage of a touch electrode layer in the flexible OLED display apparatus.

When the display mode is switched, the cathode voltage will change. In this embodiment, the acquired variation value of the cathode voltage is compared with a preset threshold value. If the variation value of the cathode voltage exceeds the preset threshold value, it indicates that the cathode voltage changes to be larger; in order to keep an amount of variation of an electric quantity of an receiver electrode constant when the cathode voltage is changed, so as to keep the electric quantity of a node capacitance between the emitter electrode and the receiver electrode unchanged, the voltage output amplitude of the emitter electrode must be adjusted accordingly, thus improving the consistency of touch performance.

Figure 4:
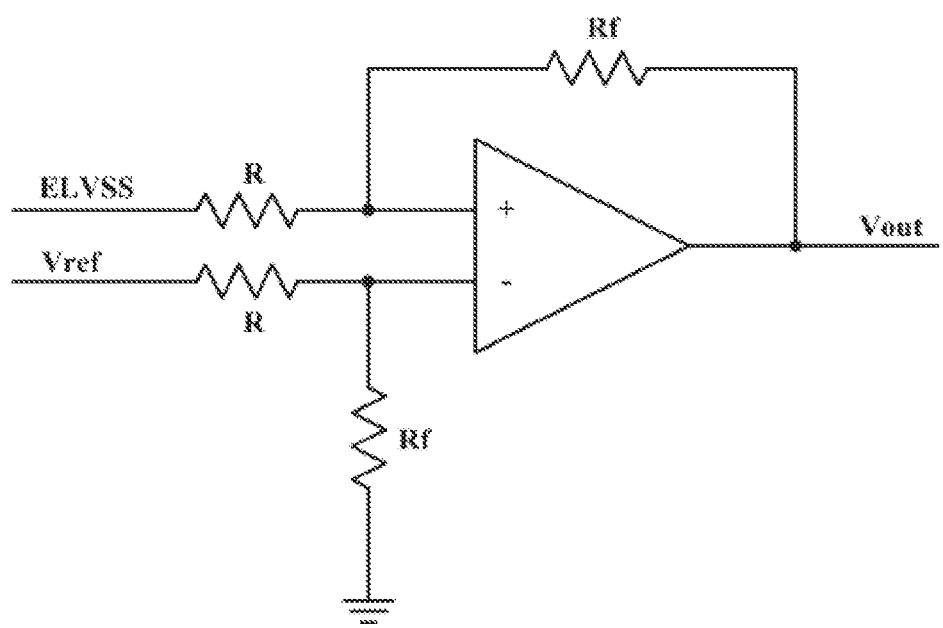
FIG. 4 is a schematic structural diagram of a differential amplifier circuit according to the first embodiment of the disclosure.

In this embodiment, there are several ways to acquire the variation value of the cathode voltage. One of the ways is to use the current cathode voltage of the flexible display apparatus and the reference voltage as two inputs of the operational amplifier in the differential amplifier circuit as shown in FIG. 4. The output voltage Vout of the operational amplifier is the amount of variation of the cathode voltage:

$$Vout = \frac{R+Rf}{R} \times \left( ELVSS \times \frac{Rf}{R+Rf} - Vref \times \frac{R+Rf}{R} \right)$$

Here, the reference voltage Vref is the cathode voltage when the flexible display apparatus is in the normal mode.

When R=Rf, Vout=ELVSS−Vref, that is, the difference between the two; when Rf=2R, Vout=2 (ELVSS−Vref), which is twice the difference between the two; that is, the variation value of the cathode voltage is a difference between the current cathode voltage and the reference voltage, or a multiple of the difference.

Another way to acquire the variation value of the cathode voltage is to input the current cathode voltage from the D/A conversion interface into the touch IC. The touch IC acquires the digital variation value through the analog variation of the cathode voltage, that is, the variation value of the cathode voltage.

For switching between different display modes of the flexible display apparatus, the preset threshold value Vth is not fixed, for example, when the normal mode is switched to the highlight mode, the preset threshold value is a first preset threshold value, which is denoted as Vth1; when the normal mode is switched to the fade mode, the preset threshold value is a second preset threshold value, which is denoted as Vth2. Therefore, each threshold value can be preset for the switching of each display mode as an accurate reference value compared with the variation value of the cathode voltage. The upper limit of the preset threshold value does not exceed the actual amount of variation of the cathode voltage at the time of switching of the display mode. For example, when the cathode voltage is reduced by 2V, the preset threshold value may be 1.5 V or 1.2 V, in this way, when the cathode voltage variation exceeds 1.5 V or 1.2 V, that is, the emitter electrode voltage is increased, and the constant electric quantity of the node capacitance between the emitter electrode and the receiver electrode can be realized, thereby avoiding the defect of the touch performance brought by the reduction of the cathode voltage by 2V. In addition, due to the manufacturing process of the flexible OLED display apparatus, the actual variation of the cathode voltage of the different screens during the switching of the display mode is not the same. For example, when the normal mode is switched to the highlight mode, the actual amount of variation of the cathode voltage of the screen 1 is 2V, and the actual amount of variation of the cathode voltage of the screen 2 is 2.2V. In this embodiment, the cathode voltage is detected in real time to acquire the variation value of the cathode voltage, which can be applied to different screens.

Figure 5:
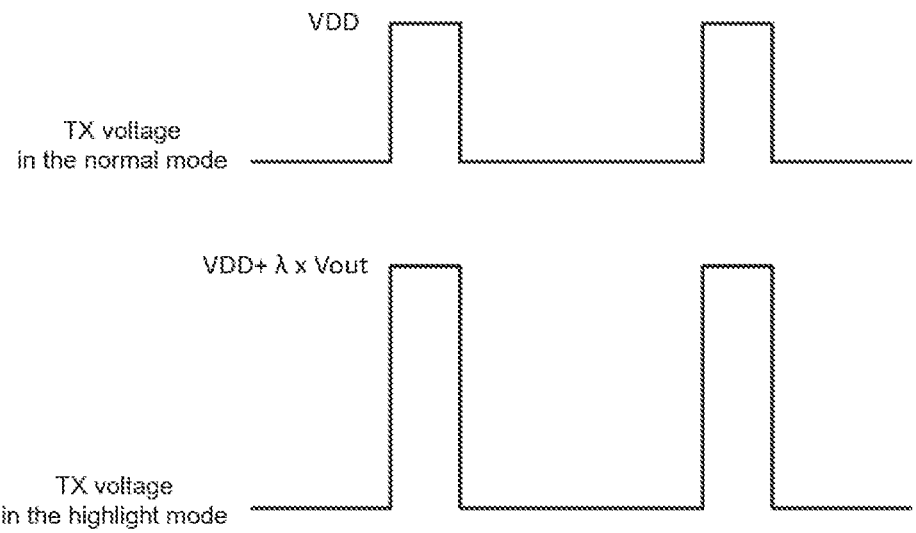
FIG. 5 is a schematic diagram of increasing a voltage amplitude of an emitter electrode in the first embodiment of the disclosure.

Referring to FIG. 5 again, in the normal mode, the voltage amplitude of the emitter electrode TX is VDD, when switching to highlight mode, the cathode voltage decreases, for example, decreases from −3V to −5V, and the finger is similar to GND (the voltage is 0 V), then the signal from the emitter electrode TX (square wave of 0~5V) is more likely to be absorbed by the cathode after the voltage is reduced, the electric quantity reaching the finger certainly decreases; according to the electric field strength formula: E=Q/d, the electric field intensity E also decreases, and therefore, only the output voltage of the emitter electrode TX is increased, and the amount of variation of the coupling capacitance before and after the display mode is switched remains the same, that is, the electric quantity of the node capacitance between the emitter electrode and the receiver electrode does not change. The voltage amplitude of the amplified emitter electrode TX becomes VDD+λ×Vout, where λ is a constant and Vout is the variation value of the cathode voltage.

Figure 6:
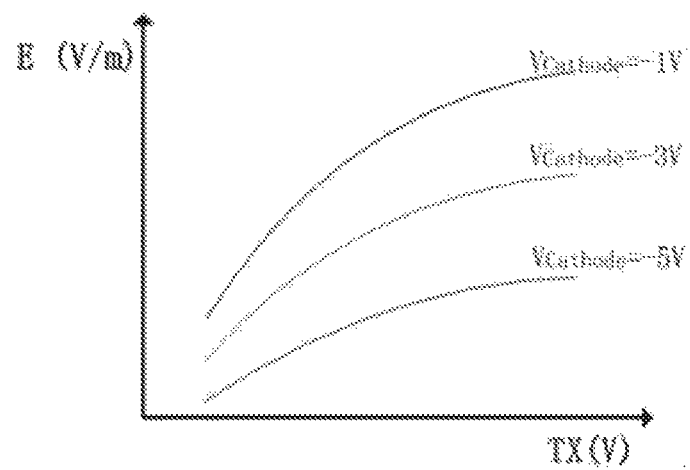
FIG. 6 is a schematic diagram of a relationship between the cathode voltage, the emitter electrode voltage and the electric field strength according to the first embodiment of the disclosure.

Again, as shown in FIG. 6, TX represents a voltage of the emitter electrode; E represents an electric field strength at the finger position; Vcathode represents a cathode voltage. As can be seen from the figure, when the cathode voltage is constant, TX increases, and the electric field strength also increases.

Figure 7:
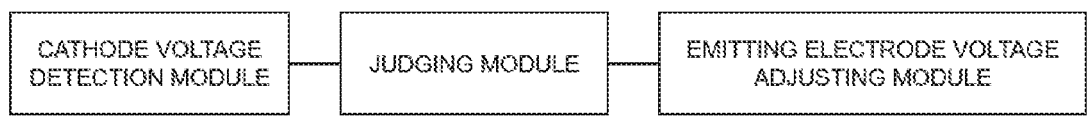
FIG. 7 is a block diagram of a touch device of a flexible display apparatus according to the second embodiment of the disclosure.

Corresponding to the first embodiment of the disclosure, the second embodiment of the disclosure provides a touch device of a flexible OLED display apparatus. As shown in FIG. 7, the touch device includes:

a cathode voltage detection module, configured to acquire a cathode voltage variation value when a display mode of the flexible OLED display apparatus is switched;

a judging module, configured to judge a magnitude relation between a cathode voltage variation value acquired by the cathode voltage detection module and a preset threshold value; and an emitter electrode voltage adjusting module, configured to increase an emitter electrode voltage of a touch electrode layer in the flexible OLED display apparatus when the judging module judges that the variation value of the cathode voltage exceeds the preset threshold value.

The current cathode voltage and the reference voltage serve as two inputs of an operational amplifier in the differential amplification circuit, and an output voltage of the operational amplifier is the variation value of the cathode voltage.

The variation value of the cathode voltage is a difference or a multiple of the difference between the current cathode voltage and the reference voltage.

The cathode voltage detection module is a touch IC, the touch IC is configured to acquire a digital variation value corresponding to the cathode voltage analog input from the D/A conversion interface and use the digital variation value as the variation value of the cathode voltage.

A presetting module is further provided, configured to set the preset threshold value respectively for switching of different display modes.

Increasing the emitter electrode voltage by the emitter electrode voltage adjusting module specifically increases a product of the variation value of the cathode voltage and a constant on the emitter electrode voltage.

For the working principle and process of this embodiment, reference may be made to the description of the first embodiment of the disclosure, and details are not described herein again.

It can be seen from the above description that the beneficial effects of the embodiments of the disclosure are as follows: when the display mode is switched, the variation value of the cathode voltage is acquired and is compared with the preset threshold value, when the variation value of the cathode voltage exceeds the preset threshold value, an output voltage of an emitter electrode is increased, so as to keep the amount of variation of the electric quantity of the receiver electrode constant when the cathode voltage is changed, thereby keeping the electric quantity of the node capacitance between the emitter electrode and the receiver electrode constant and enhancing the consistency of touch performance.

The above disclosure is only the preferred embodiments of the disclosure, and certainly cannot be used to limit the scope of the disclosure. Therefore, equivalent changes made according to the claims of the disclosure are still within the scope of the disclosure.

What is claimed is:

1. A touch method of a flexible OLED (organic light-emitting diode) display apparatus, comprising
    acquiring a variation value of a cathode voltage when a display mode of the flexible OLED display apparatus is switched; and
    comparing the variation value of the cathode voltage with a preset threshold value, and when the variation value of the cathode voltage exceeds the preset threshold value, increasing an emitter electrode voltage of a touch electrode layer in the flexible OLED display apparatus.

2. The touch method according to claim 1, wherein the step of acquiring a variation value of a cathode voltage is specifically:
    taking a current cathode voltage and a reference voltage as two inputs of an operational amplifier in a differential amplifier circuit;
    acquiring an output voltage of the operational amplifier as the variation value of the cathode voltage.

3. The touch method according to claim 2, wherein the variation value of the cathode voltage is a difference or a multiple of the difference between the current cathode voltage and the reference voltage.

4. The touch method according to claim 1, wherein the variation value of the cathode voltage acquired is specifically: inputting the cathode voltage from a D/A (digital to analog) conversion interface to a touch IC (Integrated circuit), and the touch IC acquiring a digital variation value as the variation value of the cathode voltage by an analog variation of the cathode voltage.

5. The touch method according to claim 1, wherein the preset threshold value is respectively set for switching of different display modes.

6. The touch method according to claim 1, wherein the step of increasing the emitter electrode voltage specifically is increasing a product of the variation value of the cathode voltage and a constant on the emitter electrode voltage.

7. A touch device of a flexible OLED display apparatus, comprising:
    a cathode voltage detection module, configured to acquire a variation value of a cathode voltage when a display mode of the Flexible OLED display apparatus is switched;
    a judging module, configured to judge a magnitude relation between the variation value of the cathode voltage acquired by the cathode voltage detection module and a preset threshold value; and
    an emitter electrode voltage adjusting module, configured to increase an emitter electrode voltage of a touch electrode layer in the flexible OLED display apparatus when the judging module judges that the variation value of the cathode voltage exceeds the preset threshold value.

8. The touch device according to claim 7, wherein the cathode voltage detection module comprises a differential amplifier circuit, a current cathode voltage and a reference voltage serve as two inputs of an operational amplifier in the differential amplification circuit, and an output voltage of the operational amplifier is the variation value of the cathode voltage.

9. The touch device according to claim 8, wherein the variation value of the cathode voltage is a difference or a multiple of the difference between the current cathode voltage and the reference voltage.

10. The touch device according to claim 7, wherein the cathode voltage detection module is a touch IC, the touch IC is configured to acquire a digital variation value corresponding to an analog variation of the cathode voltage input from a D/A conversion interface and use the digital variation value as the variation value of the cathode voltage.

11. The touch device according to claim 7, further comprising: a presetting module, configured to set the preset threshold value respectively for switching of different display modes.

12. The touch device according to claim 7, wherein the emitter electrode voltage adjusting module increasing the emitter electrode voltage specifically is increasing a product of the variation value of the cathode voltage and a constant on the emitter electrode voltage.

* * * * *